(12) United States Patent
Eckert et al.

(10) Patent No.: US 9,722,141 B2
(45) Date of Patent: Aug. 1, 2017

(54) OPTOELECTRONIC SEMICONDUCTOR ELEMENT, OPTOELECTRONIC SEMICONDUCTOR DEVICE AND METHOD FOR PRODUCING A PLURALITY OF OPTOELECTRONIC SEMICONDUCTOR ELEMENTS

(71) Applicant: OSRAM Opto Semiconductors GmbH, Regensburg (DE)

(72) Inventors: Tilman Eckert, Tanjung Tokong (MY); Stefan Brandl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/121,072

(22) PCT Filed: Mar. 12, 2015

(86) PCT No.: PCT/EP2015/055153
§ 371 (c)(1),
(2) Date: Aug. 24, 2016

(87) PCT Pub. No.: WO2015/154941
PCT Pub. Date: Oct. 15, 2015

(65) Prior Publication Data
US 2017/0025574 A1  Jan. 26, 2017

(30) Foreign Application Priority Data

Apr. 11, 2014  (DE) .................. 10 2014 206 995

(51) Int. Cl.
*H01L 33/10*  (2010.01)
*H01L 33/44*  (2010.01)
(Continued)

(52) U.S. Cl.
CPC .............. *H01L 33/22* (2013.01); *H01L 33/10* (2013.01); *H01L 33/44* (2013.01); *H01L 33/58* (2013.01);
(Continued)

(58) Field of Classification Search
CPC .......... H01L 33/10; H01L 33/44; H01L 33/58
See application file for complete search history.

(56) References Cited

U.S. PATENT DOCUMENTS

2005/0179376 A1   8/2005  Fung et al.
2008/0205461 A1*  8/2008  Henrichs ............ H01S 5/18391
                                                       372/29.023
(Continued)

FOREIGN PATENT DOCUMENTS

CN       200968110 Y        10/2007
DE    102005061828 A1        1/2007
(Continued)

OTHER PUBLICATIONS

International Search Report based on application No. PCT/EP2015/055153 (5 pages + 3 pages English translation) dated May 26, 2015 (for reference purpose only).

(Continued)

*Primary Examiner* — Thanh V Pham
(74) *Attorney, Agent, or Firm* — Viering, Jentschura & Partner mbB

(57) ABSTRACT

An optoelectronic semiconductor element may include at least one LED chip which emits infrared radiation via a top side during operation. The radiation has a global intensity maximum at wavelengths between 800 nm and 1100 nm. The radiation has, at most 5% of the intensity of the intensity maximum at a limit wavelength of 750 nm. The radiation has a visible red light component. The semiconductor element may further include a filter element, which is arranged (Continued)

directly or indirectly on the top side of the LED chip and which has a transmissivity of at most 5% for the visible red light component of the LED chip, wherein the transmissivity of the filter element is at least 80%, at least in part, for wavelengths between the limit wavelength and 1100 nm, and a radiation exit surface provided for emitting the filtered radiation.

17 Claims, 8 Drawing Sheets

(51) Int. Cl.
*H01L 33/22* (2010.01)
*H01L 33/58* (2010.01)
*H01L 33/62* (2010.01)

(52) U.S. Cl.
CPC ...... *H01L 33/62* (2013.01); *H01L 2933/0025* (2013.01); *H01L 2933/0033* (2013.01); *H01L 2933/0066* (2013.01)

(56) References Cited

U.S. PATENT DOCUMENTS

| | | | |
|---|---|---|---|
| 2009/0066671 | A1 | 3/2009 | Kweon et al. |
| 2009/0128028 | A1 | 5/2009 | Hildenbrand et al. |
| 2009/0173957 | A1 | 7/2009 | Brunner et al. |
| 2011/0043918 | A1* | 2/2011 | Crouse .................. B82Y 20/00 359/573 |
| 2011/0309236 | A1* | 12/2011 | Tian .................. H01L 27/14603 250/208.1 |
| 2012/0098559 | A1* | 4/2012 | Bolt ....................... G01J 1/0242 324/754.03 |
| 2012/0104291 | A1* | 5/2012 | Hohn .................. C09D 183/04 250/504 R |
| 2012/0268701 | A1 | 10/2012 | Nemoto et al. |
| 2012/0302124 | A1 | 11/2012 | Imazu |
| 2013/0334544 | A1* | 12/2013 | Luruthudass ........... H01L 31/12 257/82 |
| 2014/0191253 | A1* | 7/2014 | Haslbeck .......... H01L 31/02325 257/82 |
| 2015/0277047 | A1* | 10/2015 | Flemming ............... C03C 3/095 385/131 |
| 2015/0301176 | A1* | 10/2015 | Halbritter ........... H01L 31/0203 250/216 |

FOREIGN PATENT DOCUMENTS

| | | |
|---|---|---|
| DE | 112011100376 T5 | 11/2012 |
| DE | 102012107578 A1 | 2/2014 |
| EP | 0572917 | 12/1993 |
| EP | 0883195 A1 | 12/1998 |
| JP | 2006332288 A | 12/2006 |

OTHER PUBLICATIONS

German Search Report based on application No. 10 2014 206 995.5 (8 pages) dated Dec. 17, 2014 (for reference purpose only).

* cited by examiner

OPTOELECTRONIC SEMICONDUCTOR ELEMENT, OPTOELECTRONIC SEMICONDUCTOR DEVICE AND METHOD FOR PRODUCING A PLURALITY OF OPTOELECTRONIC SEMICONDUCTOR ELEMENTS

RELATED APPLICATIONS

The present application is a national stage entry according to 35 U.S.C. §371 of PCT application No. PCT/EP2015/055153 filed on Mar. 12, 2015, which claims priority from German application No. 10 2014 206 995.5 filed on Apr. 11, 2014, and is incorporated herein by reference in its entirety.

TECHNICAL FIELD

An optoelectronic semiconductor element, an optoelectronic semiconductor device and a method for producing a plurality of optoelectronic semiconductor elements are specified.

SUMMARY

A problem to be solved consists of specifying an optoelectronic semiconductor element and an optoelectronic semiconductor device, which emit infrared electromagnetic radiation, wherein the visible red component of the emitted spectrum is strongly suppressed such that the emitted radiation is not, or hardly, perceivable by an observer. A further problem to be solved consists of specifying a method for producing such a semiconductor element.

In accordance with at least one embodiment, the optoelectronic semiconductor element includes at least one LED chip. Here, the LED chip can be a singulated, light-emitting semiconductor layer sequence with integrated contacts and/or circuits and/or conductor tracks and/or passivation layers. In particular, the LED chip is a device which is ready for assembly and which merely needs to be contacted electrically in order to emit preferably incoherent radiation.

The LED chip has a top side, by means of which infrared radiation is emitted during operation. Furthermore, the LED chip has e.g. a semiconductor layer sequence, which is preferably based on a III/V compound semiconductor material. By way of example, the semiconductor material is an arsenide compound semiconductor material, such as $Al_nIn_{1-n-m}Ga_mAs$, or a phosphide compound semiconductor material, such as $Al_nIn_{1-n-m}Ga_mP$, where $0 \leq n \leq 1$, $0 \leq m \leq 1$ and $n+m \leq 1$ in each case. Here, the semiconductor layer sequence can have doping substances and additional components. However, for reasons of simplicity, only the essential components of the crystal lattice of the semiconductor layer sequence, i.e. Al, As, Ga, In or P, are specified, even if these can, in part, be replaced and/or complemented by small amounts of further substances. The semiconductor layer sequence is preferably based on AlInGaAs.

The semiconductor layer sequence includes at least one active layer which is configured to generate electromagnetic radiation. In particular, the active layer contains at least one pn-junction and/or at least one quantum well structure. Radiation generated by the active layer during operation lies, in particular, in the spectral range between 600 nm and 1200 nm, inclusive.

In accordance with at least one embodiment, the radiation emitted by the LED chip has a global intensity maximum at wavelengths between 800 nm and 1100 nm, inclusive, preferably between 830 nm and 970 nm, inclusive.

In accordance with at least one embodiment of the semiconductor element, the radiation emitted by the LED chip has at most 5% of the intensity of the intensity maximum at a limit wavelength. Here, the limit wavelength is shorter than the wavelength at which the radiation has the intensity maximum. By way of example, the limit wavelength can be defined by virtue of the human eye not being able to perceive this radiation, or only being able to perceive this radiation in a very much reduced manner, above this limit wavelength, i.e. at longer wavelengths. By way of example, the photopic or scotopic capability of the human eye has fallen to less than 1% or 1/1000 or 1/10000 or 1/1000000 of the maximum visual faculty at the limit wavelength. By way of example, the limit wavelength can lie between 700 nm and 800 nm, inclusive, for example at 740 nm or 750 nm or 760 nm or 770 nm or 780 nm or 790 nm.

In accordance with at least one embodiment, the radiation emitted by the LED chip has a red light component visible to the human eye.

By way of example, the intensity distribution of the radiation emitted by the LED chip falls continuously and monotonically to zero below the limit wavelength. By way of example, the radiation emitted by the LED chip is perceived as weak red glowing by the human eye. Alternatively, the intensity of the emitted radiation can also increase again below the limit wavelength and, for example, form a local intensity maximum in the red spectral range. The intensity component of the visible red light in terms of the overall intensity of the radiation emitted by the LED chip is e.g. at most 1% or 0.5% or 0.1% or 0.01%. Alternatively, or additionally, the component of the visible red light of the overall intensity is at least 1/100000 or 1/50000 or 1/20000. By way of example, the intensity of the visible red light is at least 0.5 µW or 1 µW or 5 µW. Alternatively, or additionally, the intensity of the visible red light is ≤20 µW or ≤15 µW or ≤10 µW.

In accordance with at least one embodiment of the semiconductor element, the latter has a filter element. Here, the filter element is arranged indirectly or directly on the top side of the LED chip and preferably connected to the LED chip in a mechanically secured manner. The semiconductor element can therefore be an assemblage of LED chip and filter element which can be handled. In particular, the filter element can have direct or indirect contact with the LED chip. Preferably, no gap or slit is formed between the filter element and the LED chip.

In accordance with at least one embodiment, the filter element is provided to filter out the visible red light component of the radiation from the LED chip. Preferably, to this end, the filter element has a transmissivity of at most 5% or 1% or 0.1% for the visible red light component, in particular for the whole visible red light component, of the LED chip. Here, and below, the visible red light component can be understood to mean e.g. light with wavelengths between 600 nm and the limit wavelength, inclusive, or between 610 nm and the limit wavelength, inclusive. If the radiation of the LED chip has a local intensity maximum or dominant wavelength in the red visible spectral range, the transmissivity of the filter element can also be at most 5% or 1% or 0.1% only in the region of at most ±30 nm or ±40 nm or ±50 mm about the local intensity maximum or the dominant wavelength.

In accordance with at least one embodiment, the filter element has a transmissivity which is at least 70% or 80% or 90% or 95%, at least in part, for wavelengths longer than the limit wavelength and shorter than a wavelength of 1000 nm or 1100 nm or 1200 nm. In particular, the transmissivity can be at least 80% or 90% or 95% everywhere or only in the region of at most ±10 nm or ±20 nm or ±50 nm about the global intensity maximum of the radiation emitted by the LED chip.

In accordance with at least one embodiment, the semiconductor element has a radiation exit surface provided for emitting the filtered radiation. Here, the radiation exit surface is formed, for example, by the side of the filter element facing away from the LED chip.

In at least one embodiment of the optoelectronic semiconductor element, the latter includes at least one LED chip which emits infrared radiation via a top side during operation. The radiation has a global intensity maximum at wavelengths between 800 nm and 1100 nm. Furthermore, the radiation has at most 5% of the intensity of the intensity maximum at a limit wavelength of 750 nm. Moreover, the radiation has a visible red light component. Moreover, the semiconductor element includes a filter element, which is arranged directly or indirectly on the top side of the LED chip and which has a transmissivity of at most 5% for the visible red light component of the LED chip. The transmissivity of the filter element is at least 80%, at least in part, for wavelengths between the limit wavelength and 1100 nm, in particular at the wavelength at which the global intensity maximum occurs. Furthermore, the semiconductor element includes a radiation exit surface provided for emitting the filtered radiation, said radiation exit surface being formed by the side of the filter element facing away from the LED chip.

LED chips which emit in the infrared spectral range often generate a red glow which is visible to an observer. This red glow is due to the fact that infrared LED chips also have a small component of visible red light in the emitted radiation thereof. Since such a red glow of infrared LED chips may be bothersome to an observer, the present disclosure described here makes use of the concept of placing a filter element onto the LED chip, in particular directly, said filter element filtering out the red components of the radiation to the extent that the radiation spectrum emitted by the semiconductor element is no longer visible to an observer. By way of example, such a semiconductor element can be used in modern cellular telephones, such as smartphones, or in tablet PCs.

In accordance with at least one embodiment of the semiconductor element, the filter element is a band-pass filter. The band-pass filter has a transmission maximum at a wavelength of ≥750 or ≥850 or ≥900 nm. Alternatively, or additionally, the transmission maximum lies at a wavelength of ≤1200 nm or 1100 nm or 1000 nm or 900 nm. Moreover, the band-pass filter has a full width at half maximum, abbreviated FWHM, of at least 2 nm or 3 nm or 10 nm. Alternatively, or additionally, the full width at half maximum of the band-pass filter is at most 80 nm or 60 nm or 40 nm. In respect of the definition of full width at half maximum of a transmission curve, those points of the transmission curve at which the transmissivity has fallen to 50% of the transmission maximum are selected on both sides of the transmission maximum. The distance between these two points specifies the full width at half maximum in nanometers.

In particular, the band-pass filter can have a transmission curve with a rectangular shape or with virtually a rectangular shape. By way of example, the transmission curve for wavelengths longer than the limit wavelength increases steeply in the direction of increasing wavelengths from 1% or 5% or 10% of the transmission maximum to 80% or 90% or 95% of the transmission maximum. In this context, "steeply" means that the transmission curve increases over less than 20 nm or less than 10 nm or less than 5 nm. After this steep increase, the transmission curve has, for example, a plateau-shaped embodiment, i.e. the transmissivity varies by less than 10% or less than 5% or less than 2% around the transmission maximum. By way of example, the plateau-shaped extent can extend over a region of at least 2 nm or 10 nm or 80 nm. After the transmission plateau, the transmission curve once again drops steeply to values below 1% or 5% or 10% of the transmission maximum.

In accordance with at least one embodiment, the filter element has a carrier substrate. Applied onto the carrier substrate is a filter layer which is provided for filtering the radiation of the LED chip. The carrier substrate has, for example, a material which is transparent and/or clear to the infrared radiation of the LED chip, or it consists of such material. By way of example, the carrier substrate consists of glass or silicon. The thickness of the carrier substrate is preferably at least 0.2 mm or 0.3 mm or 0.5 mm. Alternatively, or additionally, the thickness of the carrier substrate is ≤5 mm or ≤3 mm or ≤1 mm. The filter layer applied onto the carrier substrate has a thickness of at least 0.2 μm or 0.5 μm or 1 μm. Alternatively, or additionally, the thickness of the filter layer is ≤10 μm or ≤5 μm or ≤1 μm.

In accordance with at least one embodiment, the filter element or the filter layer is embodied as a dielectric filter or interference filter with, for example, a plurality of layers with different refractive indices.

In accordance with at least one embodiment, the filter element is a high-pass filter with a GaAs carrier substrate, and an AlGaAs filter layer grown onto the GaAs carrier substrate and serving as a filter. Here, a high-pass filter is understood to mean that the transmissivity of the filter element has a plateau-shaped curve above a specific wavelength and the width of the plateau is at least 100 nm or 200 nm or 500 nm. Alternatively, or additionally, the GaAs carrier substrate can already also serve as filter for the radiation emitted by the LED chip.

In accordance with at least one embodiment, the filter element is applied to the LED chip in such a way that the filter layer faces the LED chip. The radiation exit surface of the semiconductor element is therefore formed by the carrier substrate of the filter element in this case. The filter layer is preferably in direct or indirect contact with the LED chip. In particular, no air gap or slit is formed between the filter layer and the LED chip.

What is achieved as a result of such a refinement of the semiconductor element is that the radiation emitted by the LED chip is filtered by the filter layer close to the chip. Then, the radiation which penetrates the carrier substrate from the filter layer is already filtered and can escape from the semiconductor element through the transparent carrier substrate. Advantageously, the sensitive filter layer is protected from external influences, e.g. from contact, by arranging the filter layer between the carrier substrate and the LED chip. This increases the service life of the semiconductor element.

In accordance with at least one embodiment, the filter element is applied to the top side of the LED chip by means of an adhesive. By way of example, the adhesive can be a resin or a silicone adhesive with a thickness of between 2 μm and 20 μm, inclusive. Here, the adhesive preferably does not touch the filter layer of the filter element or at least does not damage the latter.

In accordance with at least one embodiment of the semiconductor element, the filter element is a lacquer layer applied to the LED chip. Here, the lacquer layer can serve as a high-pass filter, which absorbs the visible red light component emitted by the LED chip. By way of example, the lacquer layer has a polyacrylate as a carrier matrix mixed with color pigments, or it consists thereof. By way of example, the thickness of the lacquer layer on the LED chip is at least 500 nm or 1 µm or 1.5 µm. Alternatively, or additionally, the thickness of the lacquer layer is ≤20 µm or ≤10 µm or ≤5 µm.

In accordance with at least one embodiment, the filter element covers at least 70% or 80% or 90% of the surface of the top side of the LED chip provided for the radiation emission.

In accordance with at least one embodiment, the LED chip has a bond pad region, provided for electrical contacting, in a region of the top side. By way of example, the top side of the LED chip has a rectangular design. By way of example, the bond pad region can have a circular or rectangular or quarter-circle-shaped embodiment in one corner of the rectangle.

In accordance with at least one embodiment, the filter element has the same form as, or a similar form to, the top side of the LED chip. By way of example, if the top side of the LED chip has a rectangular form, the filter element can also have a rectangular basic shape with the same side dimensions as the top side of the LED chip. Then, the filter element is preferably applied to the top side of the LED chip in such a way that the LED chip and the filter element overlap congruently in a plan view of the radiation exit surface. However, alternatively, it is also possible for the filter element to project beyond the LED chip on one or more or all sides in the plan view and/or for the LED chip to project beyond the filter element on one or more or all sides.

Furthermore, the filter element can have a cutout which exposes the bond pad region of the LED chip. Here, the cutout in the filter element is preferably matched to the bond pad region in such a way that the whole surface provided for radiation emission on the top side of the LED chip is covered by the filter element. That is to say, the cutout in the filter element only leaves clear the bond pad region, which, for example, is the only region on the top side of the LED chip not provided for radiation emission. By way of example, the bond pad region can be metallized or have a contact element.

In accordance with at least one embodiment, the filter element has sawing grooves on the side faces. Here, the sawing grooves can be created during the production process of the filter element when the latter is cut to size with the aid of a sawing process in such a way that it covers the top side of the LED chip. The side faces of the filter element extend across the radiation exit surface of the semiconductor element.

In accordance with at least one embodiment, the filter element has lattice defects in the carrier substrate on the side surfaces. Such lattice defects may arise, for example, when the filter element is cut to size by a laser separation method during a shaping process. Lattice defects are generated in the carrier substrate of the filter element during the laser separation method or stealth dicing method, said lattice defects serving as predetermined breaking points for subsequently breaking the filter element. With the aid of such a stealth dicing method, the filter element can not only be cut to size in a rectangular fashion but it can likewise have basic shapes with rounded corners as may be required, for example, for leaving clear a bond pad region. By way of example, a stealth dicing method is described in the document WO 2011/104097 A1, the disclosure of which is incorporated herein by reference.

In accordance with at least one embodiment of the semiconductor element, the LED chip is embodied as a thin-film semiconductor chip. Thus, in particular, the LED chip no longer has any growth substrate, onto which the radiation-emitting semiconductor layer sequence was grown. Such a thin-film semiconductor chip is particularly suitable for the semiconductor element described here since the thin-film semiconductor chip can be operated as a surface emitter, which emits virtually all of the electromagnetic radiation produced via the top side thereof. This in turn renders it possible to filter all of the radiation emitted by the LED chip by means of the filter element.

Moreover, an optoelectronic semiconductor device is specified. The semiconductor device can be provided with a semiconductor element of the embodiments described above. Therefore, features of the semiconductor element are also disclosed for the optoelectronic semiconductor device, and vice versa.

In accordance with at least one embodiment, the optoelectronic semiconductor device includes a carrier with a carrier main side. By way of example, the carrier can be a metal carrier or a printed circuit board, abbreviated PCB, or a ceramic carrier, for example with portions made of aluminum oxide or aluminum nitride.

In accordance with at least one embodiment, a first and a second contact metallization is applied on the carrier main side of the carrier. By way of example, the first contact metallization and second contact metallization can be formed as a layer or as a platelet made of a metal, such as gold or silver or aluminum or palladium or platinum or nickel, or an alloy of such metals. Here, the first contact metallization and second contact metallization are not in direct contact with one another and are electrically insulated from one another, for example by the carrier.

In accordance with at least one embodiment, a semiconductor element with an LED chip and a filter element are applied to the carrier top side of the carrier. By way of example, the semiconductor element can be arranged on the first contact metallization of the carrier. Here, the radiation exit surface of the semiconductor element preferably faces away from the carrier main side such that the semiconductor element emits filtered radiation in a direction away from the carrier. The semiconductor element can be electrically contacted by means of the first contact metallization and second contact metallization, permitting the operation of the semiconductor element.

In accordance with at least one embodiment of the semiconductor device, a radiation-transmissive or radiation-absorbing or radiation-reflecting potting, in particular silicone potting, is applied to the carrier. Here, the potting can be transparent or opaque to the light emitted by the semiconductor element. Here, the potting surrounds the side faces of the semiconductor element, preferably with a form fit. In particular, all side surfaces of the semiconductor element can be partly or completely covered by the potting in a form-fit manner such that, in a plan view of the radiation exit surface, the semiconductor element is surrounded all around, either partly or completely, by a continuous layer of the potting. The side surfaces of the semiconductor element are those surfaces which extend across the radiation exit surface of the semiconductor element. By way of example, the side surfaces of the semiconductor element are formed both by the side surfaces of the LED chip and by the side surfaces of the filter element. In this context, a "form fit" means that the potting is preferably in direct contact with the side surfaces of the semiconductor element and covers and forms around the side surfaces, either partly or completely.

In accordance with at least one embodiment, the potting terminates flush with the semiconductor element at the radiation exit surface of the semiconductor element. In particular, the radiation exit surface of the semiconductor element is free from the potting. The radiation exit surface and the potting can then form a plane surface on the end side. What is achieved by such a design of the semiconductor device is that, for example, the side surfaces of the semiconductor element, which are generally not provided for radiation emission, are protected by the potting but the radiation exit surface of the semiconductor element, and hence the light decoupling, is not disturbed by the potting.

In accordance with at least one embodiment, the potting has a reflecting or mirroring, in particular diffusely scattering, embodiment for the radiation emitted by the semiconductor element. To this end, the potting can be provided with e.g. $TiO_2$ particles. Such a reflecting or diffusely scattering design of the potting can be advantageous, for example, when the LED chip of the semiconductor element is not embodied as a surface emitter but as a volume emitter. As a volume emitter, the LED chip has e.g. a growth substrate or carrier substrate which is more than 50 μm or 100 μm thick and, in particular, transparent, by way of the side surfaces of which radiation can be emitted. The light emitted by the side surfaces of the LED chip is generally not filtered by the filter element and can therefore be perceived by a user as red glowing.

In accordance with at least one exemplary embodiment, the semiconductor element can be provided, for example, as a radiation source for an image sensor. By way of example, the image sensor can be a silicon chip. The wavelength range of the photosensitivity of the image sensor can overlap with the wavelength range of the radiation emitted by the LED chip. Furthermore, the image sensor can detect electromagnetic radiation, the wavelength of which is shorter than the limit wavelength. The image sensor can detect electromagnetic radiation which can also be detected by the human eye. The image sensor and the semiconductor element can be part of a detection system. By way of example, the detection system can be provided for identifying gestures or movements. Furthermore, the semiconductor element can also be provided for transmitting data in the IR spectrum.

Moreover, a method for producing a plurality of semiconductor elements is specified. In particular, the method can be used to produce a semiconductor element in accordance with the embodiments above. Features of the semiconductor element are therefore also disclosed for the method, and vice versa.

In accordance with at least one embodiment of the method, a wafer assemblage is initially provided. Here, the wafer assemblage has a semiconductor layer sequence suitable for emitting radiation in the infrared range. The semiconductor layer sequence is preferably arranged on a carrier substrate, e.g. a growth substrate.

In accordance with at least one embodiment of the method, a lacquer layer is applied to the semiconductor layer sequence. The lacquer layer is suitable for filtering out the visible red component from the radiation emitted by the semiconductor layer sequence. By way of example, the lacquer layer can be applied onto the semiconductor layer sequence by means of a spin-coating method.

In accordance with at least one embodiment of the method, the lacquer layer is structured after application and the filter elements of the semiconductor elements are produced in the process. By way of example, the lacquer layer can be structured by means of a lithography process. To this end, the lacquer layer can be, in particular, a negative photoresist, which becomes insoluble when exposed to UV light. During the structuring of the lacquer layer, the regions which form the subsequent radiation exit surfaces of the semiconductor elements are set. Thus, both the form of the filter elements and cutouts in the filter elements can be defined in the process step.

In accordance with at least one embodiment of the method, the wafer assemblage with the finished filter elements is singulated after structuring the lacquer layer, with a plurality of semiconductor elements arising. By way of example, the semiconductor elements are singulated by way of a laser separation method or sawing process. In order not to contact the lacquer layer in the process, a protective lacquer, for example on the basis of a polyvinyl alcohol, can be applied onto the lacquer layer prior to the separation method. This protective lacquer can be removed again after the separation method.

Below, an optoelectronic semiconductor element described here, an optoelectronic semiconductor device, and a method for producing a plurality of optoelectronic semiconductor elements are explained in more detail below on the basis of exemplary embodiments, with reference being made to the drawings. Here, the same reference signs specify the same elements in the individual figures. However, no references in relation to scale are depicted; instead, individual elements can be depicted in an excessively large manner for an improved understanding.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1A:
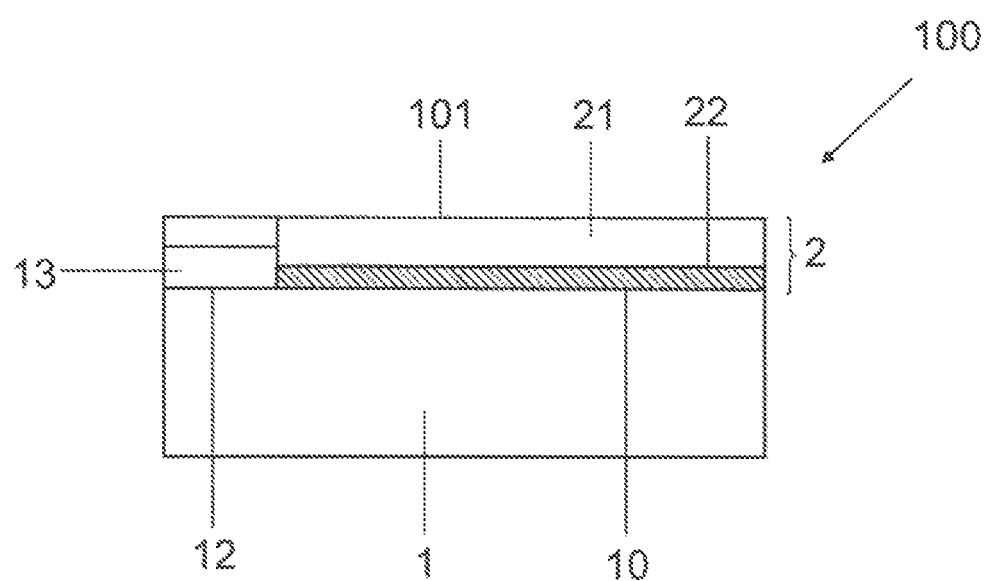
FIGS. 1A to 1C show schematic illustrations of a semiconductor element described here, in a sectional illustration and in top views.

FIG. 1A shows a sectional illustration of an exemplary embodiment of an optoelectronic semiconductor element 100. An LED chip 1 has a top side 10. By way of example, the LED chip 1 is an AlInGaAs semiconductor chip. By way of example, the LED chip 1 is embodied as a thin-film chip with a thickness of e.g. 5 μm.

A contact element 13 is arranged in a bond pad region 12 at the edge of the LED chip 1 on the top side 10 of the LED chip 1. Additionally, a filter element 2 is applied to the top side 10 of the LED chip 1, for example by means of a silicone adhesive. No gap or slit is formed between the LED chip 1 and the filter element 2, i.e. the filter element 2 is in direct contact with the LED chip or it has indirect contact therewith by means of the adhesive. Preferably, the filter element 2 does not cover the bond pad region 12, i.e. the contact element 13 is freely accessible and can be used for electrical contacting.

The filter element 2 has a carrier substrate 21 and a filter layer 22. The filter element 2 is arranged on the LED chip 1 in such a way that the filter layer 22 faces the LED chip 1. As a result, the filter layer 22 is e.g. protected by way of the carrier substrate 21 from external influences or from being touched. The carrier substrate 21 forms a radiation exit surface 101 of the semiconductor element 100 facing away from the top side 10.

By way of example, the carrier substrate 21 has a thickness of 300 μm and consists of silicon or glass. By way of example, the thickness of the filter layer 22 is 1 μm.

Figure 1B:
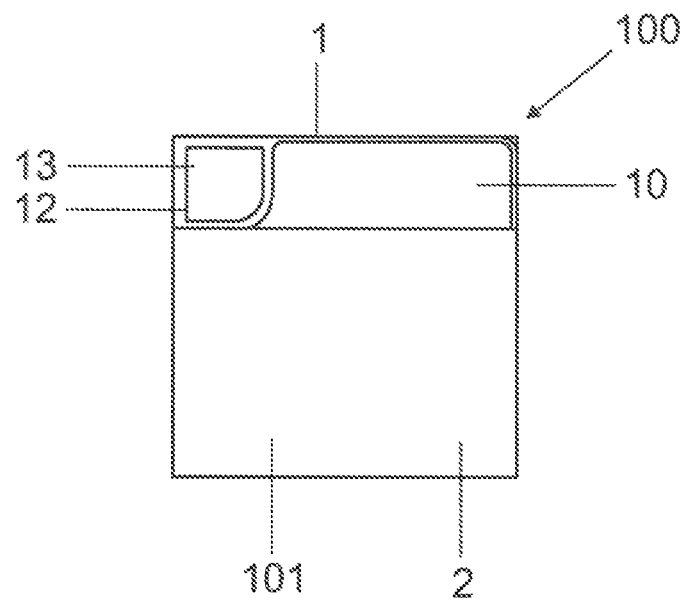

FIG. 1B shows a semiconductor element 100 in a top view onto the radiation exit surface 101. The LED chip 1 has a rectangular or square cross-sectional shape. The bond pad region 12 with the contact element 13 situated thereon is formed on the top side 10 in one corner of the LED chip 1. The filter element 2 likewise has a rectangular cross-sectional form and is applied to the top side 10 of the LED chip 1 in such a way that it terminates flush with the LED chip 1 on three sides. Alternatively, it is also conceivable for the filter element to project beyond the LED chip or for the LED chip to project beyond the filter element on one or more or all sides.

A rectangular region which is not covered by the filter element 2 is defined on the top side 10 of the LED chip 1 by way of the dimensions of the bond pad region 12 or of the contact element 13. In the embodiment of FIG. 1B, the filter element 2 covers e.g. 80% of the surface of the top side 10 of the LED chip 1 provided for radiation emission. The bond pad region 12 is not provided for emitting radiation; therefore, no radiation emerges from the LED chip 1 in this region either.

Figure 1C:
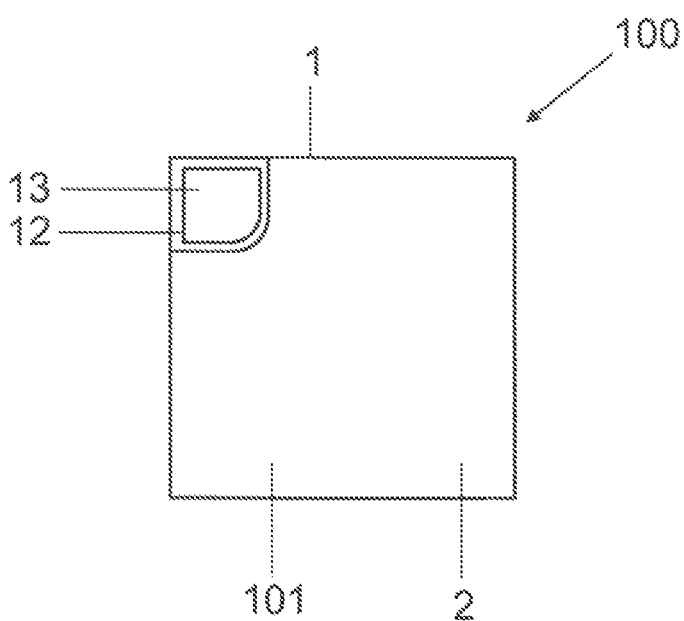

FIG. 1C shows a further embodiment of a semiconductor element 100 in a top view onto the radiation exit surface 101. In contrast to the embodiment in FIG. 1B, the filter element 2 now has a rectangular cross-sectional form with a cutout in one corner. The cutout has the shape of a quarter circle and leaves the region of the top side 10 of the LED chip 1 which is provided with the bond pad region 12 or the contact element 13 free. In FIG. 1C, the filter element 2 completely covers the surface of the top side 10 of the LED chip 1 provided for radiation emission. By way of example, the contact pad region 12 of the top side 10 has a metallization and is not provided for emitting radiation.

Figure 2:
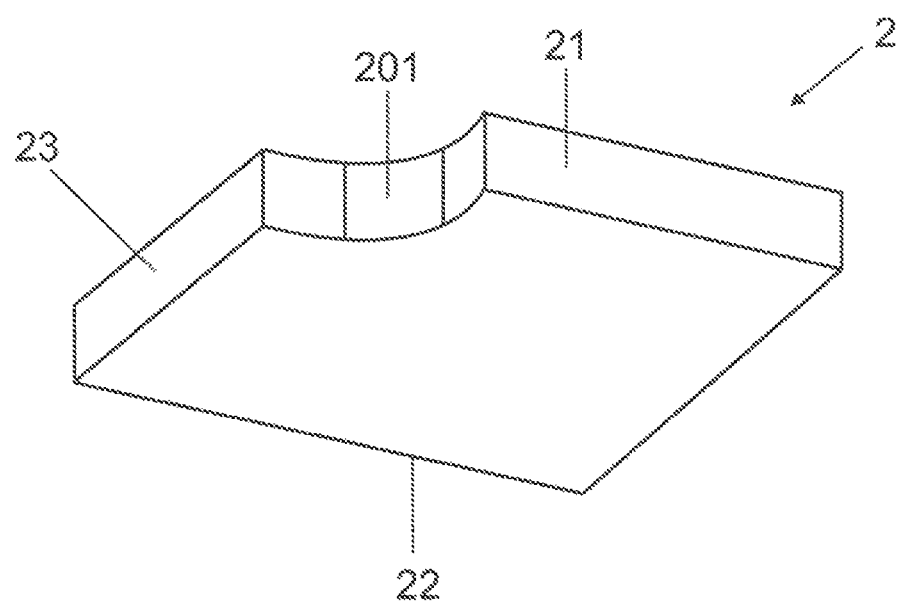
FIG. 2 shows a schematic perspective illustration of a filter element described here.

FIG. 2 shows the filter element 2 in a perspective illustration. The filter element 2 has the carrier substrate 21 and a thin filter layer 22 which is provided for filtering the radiation. Furthermore, FIG. 2 shows a quarter-circle-shaped cutout 201 in one corner of the filter element 2. By way of example, such a round cutout 201 can be introduced into the filter element 2 with the aid of a laser separation method, such as the stealth dicing method. As a consequence of the stealth dicing process, the side surfaces 23 of the filter element 2 can have lattice defects in the carrier substrate 22.

Figure 3:
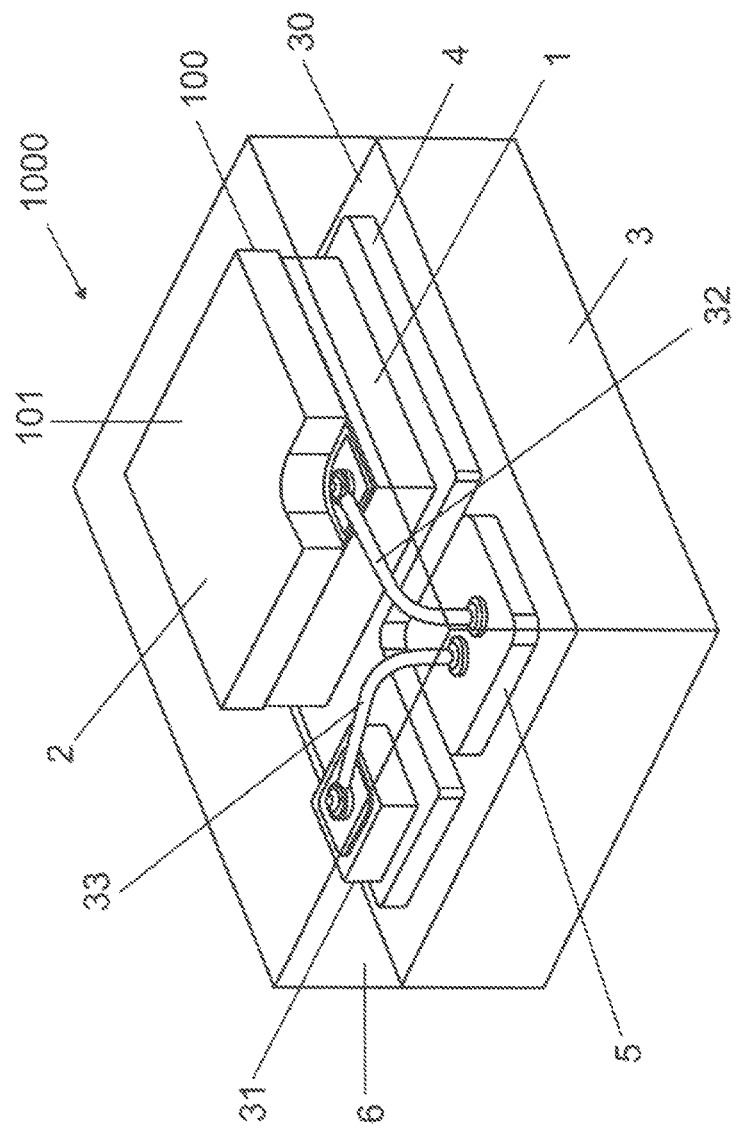
FIG. 3 shows a schematic perspective illustration of an exemplary embodiment of an optoelectronic semiconductor device described here.

An optoelectronic semiconductor device 1000 is shown in a perspective illustration in the exemplary embodiment of FIG. 3. The depicted semiconductor device 1000 can be e.g. a surface-mounted device. The semiconductor device 1000 has a carrier 3 with a carrier main side 30. By way of example, the carrier 3 can be a ceramic carrier made of aluminum nitride. Moreover, a first contact metallization 4 and a second contact metallization 5 are applied to the carrier main side 30. The first contact metallization 4 and the second contact metallization 5 are not in direct contact with one another and are electrically insulated from one another, for example by way of the carrier 3. Connection contacts configured to connect the semiconductor device 1000 electrically and mechanically to a circuit carrier, such as e.g. a printed circuit board, can be provided on the lower side of the semiconductor device 1000, which is not visible here.

A semiconductor element 100 is applied onto the first contact metallization 4 in such a way that the radiation exit surface 101 of the semiconductor component 100 faces away from the carrier 3. Here, the semiconductor element 100 is electrically contacted with the first contact metallization 4. Like in the embodiments of FIGS. 1A to 1C, that semiconductor element 100 has an LED chip 1 and a filter element 2 applied to the LED chip 1.

In FIG. 3, the semiconductor element moreover has a bond pad region 12 on the top side 10 of the LED chip 1. The bond pad region 12 or the contact element 13 is connected in an electrically conductive manner to the second contact metallization 5 by way of a contact wire 32 such that the semiconductor element 100 is electrically contacted by the first contact metallization 4 and the second contact metallization 5. Additionally, a protection diode 31 is provided on the first contact metallization 4 in FIG. 3, said protection diode likewise being connected in an electrically conductive manner to the second contact metallization 5 by means of a further contact wire 33. By way of example, the protective diode 31 protects the semiconductor element 100 from voltage surges.

Moreover, a silicone potting 6 is applied to the carrier main side 30 in the embodiment of FIG. 3. The silicone potting 6 surrounds the side surfaces of the semiconductor element 100 with form fit, i.e. the silicone potting 6 is in direct contact with the side faces of the semiconductor element 100 and forms around the side surfaces. In particular, the side surfaces can be completely covered by the silicone potting 6. In a plan view of the radiation exit surface 101, the silicone potting 6 extends completely around the semiconductor element 100. In a direction away from the carrier main side 30, the silicone potting 6 terminates flush with the radiation exit surface 101 and forms a plane with the radiation exit surface 101. Thus, the radiation exit surface 101 is not covered by the silicone potting 6 and it is exposed. Alternatively, the radiation exit surface 101 could, however, also be covered by a thin layer of the silicone potting 6, either partly or completely. Furthermore, the silicone potting 6 forms around the first contact metallization 4 and second contact metallization 5 and the protective diode 31 and protects these from e.g. mechanical loads.

By way of example, the silicone potting 6 can have a reflecting embodiment; for example, the silicone potting can contain $TiO_2$ particles. As result of such a reflecting silicone potting 6, radiation which is emitted by way of the side surfaces of the semiconductor element 100 cannot escape from the semiconductor device 1000. Instead, only filtered radiation escapes from the semiconductor device 1000 by way of the radiation exit surface 101.

Figure 4A:
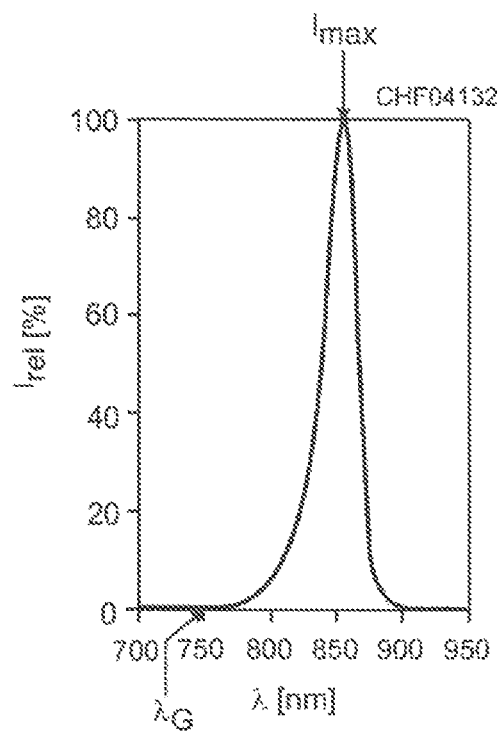
FIGS. 4A-4B and 5 show schematic illustrations of intensity distributions and transmission curves of a semiconductor element described here.
Figure 4B:
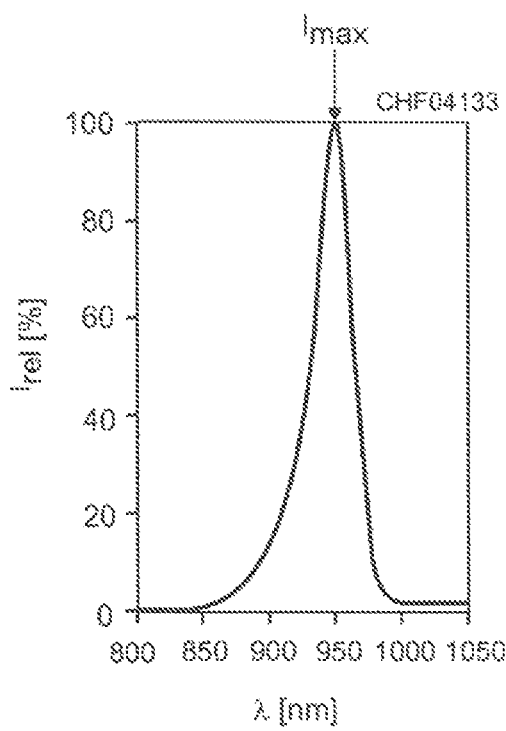

FIGS. 4A and 4B show intensity distributions of the radiation in the infrared range emitted by the LED chip 1. In FIG. 4A, the intensity maximum $I_{max}$ lies at a wavelength of approximately 850 nm. The intensity distribution decreases steeply to smaller wavelengths and only still reaches approximately 5% of the intensity maximum $I_{max}$ at values of 800 nm. At a limit wavelength $\lambda_G$ of 750 nm, the intensity has fallen to less than 5% of the intensity maximum $I_{max}$.

FIG. 4B shows an intensity distribution which is similar to the one in FIG. 4A. However, the intensity maximum $I_{max}$ lies at approximately 950 nm in FIG. 4B. In FIG. 4B, the intensity has also dropped to less than 5% of the intensity maximum $I_{max}$ at a limit wavelength $\lambda_G$ of 750 nm.

Figure 5:
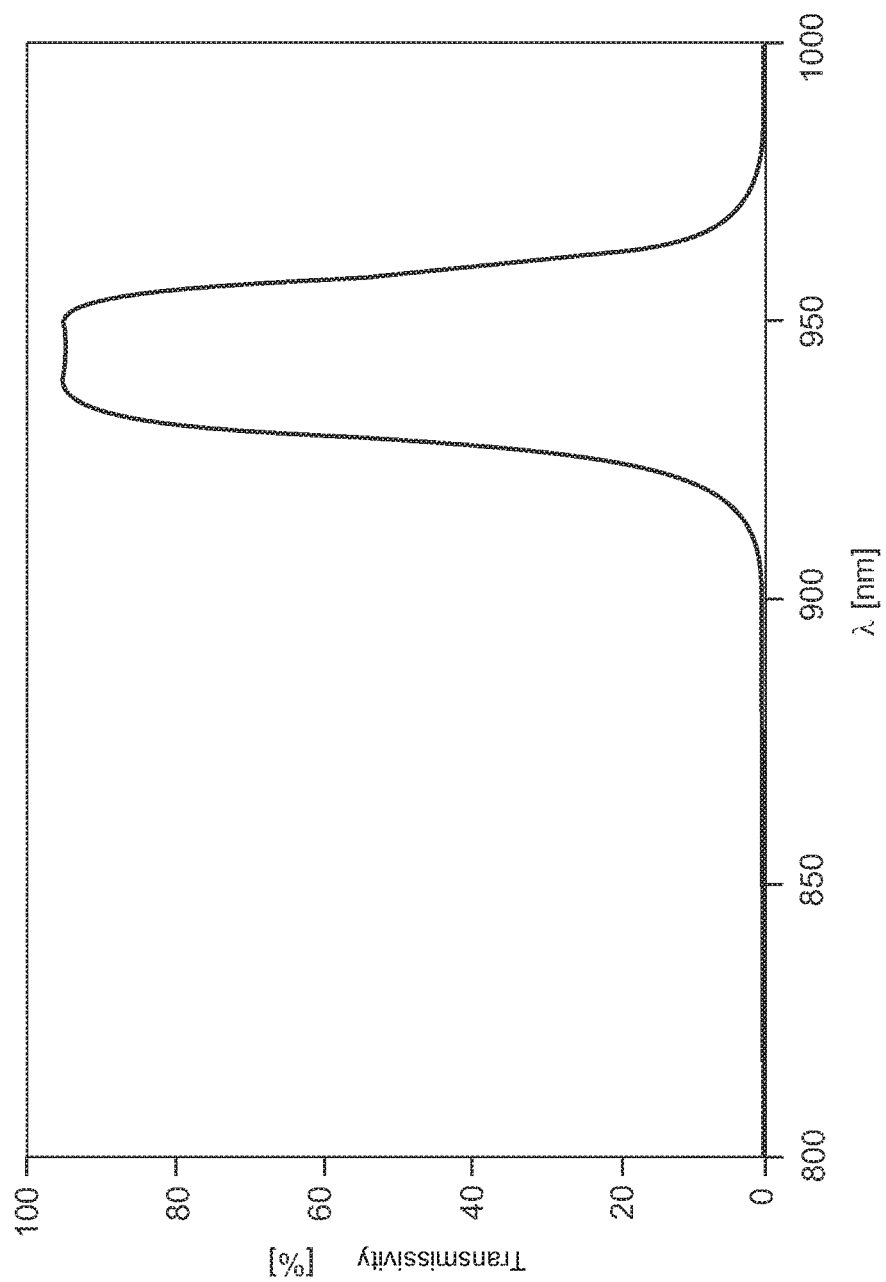

FIG. 5 depicts the transmissivity of a filter element 2 described here. Here, the filter element 2 is embodied as a band-pass filter. The band-pass filter has a plateau-shaped transmission maximum between approximately 930 nm and 950 nm. On both sides of the transmission plateau, the transmissivity falls from approximately 95% to less than 5% within less than 20 nm. The full width at half maximum of the transmission curve shown in FIG. 5 is approximately 40 nm.

Figure 6A:
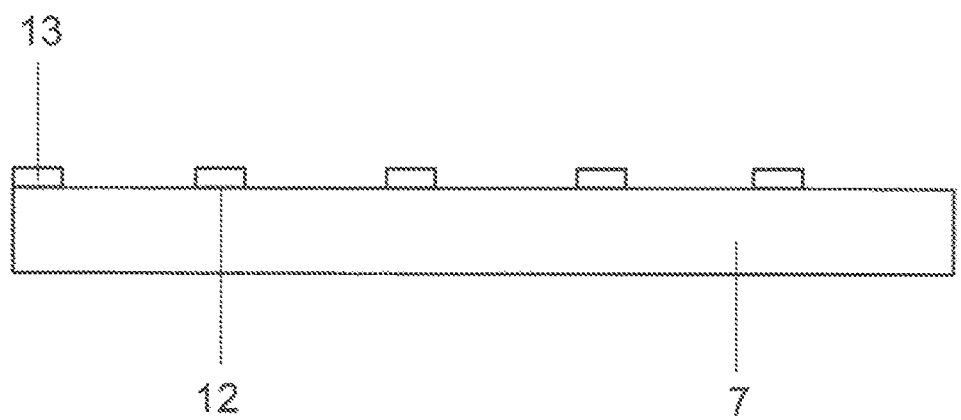
FIGS. 6A to 6E show schematic illustrations of method steps for producing the semiconductor elements described here.

FIGS. 6A to 6D schematically depict a method for producing a plurality of optoelectronic semiconductor elements 100 in a side view. In FIG. 6A, a wafer assemblage 7 with a carrier substrate and a semiconductor layer sequence suitable for emitting infrared radiation is initially provided. Furthermore, contact pad regions 12 and contact elements 13 situated thereon are arranged on the wafer assemblage 7.

Figure 6B:
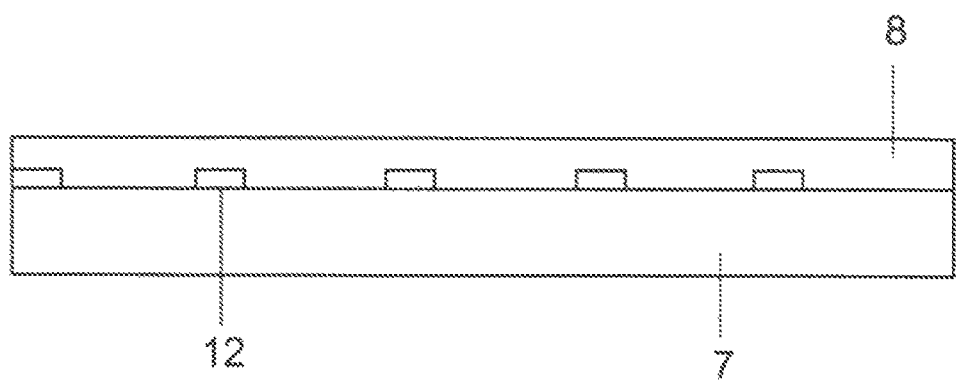

FIG. 6B shows a subsequent method step, in which a lacquer layer 8 is applied onto the side of the wafer assemblage 7 on which the bond pad regions 12 are also situated. By way of example, the lacquer layer 8 is applied to the wafer assemblage 7 by means of a spin coating method and it has a thickness of 1.5 µm after application. Here, the lacquer layer 8 is in direct contact with the wafer assemblage 7 and, for example, completely surrounds the contact elements 13. By way of example, the lacquer layer 8 has a polyacrylate as a carrier matrix, mixed with color pigments provided for filtering. By way of example, the IR-Pass material SI-5000 from the COLOR MOSAIC series by FUJIFILM may be provided as the material for the lacquer layer 8.

Figure 6C:
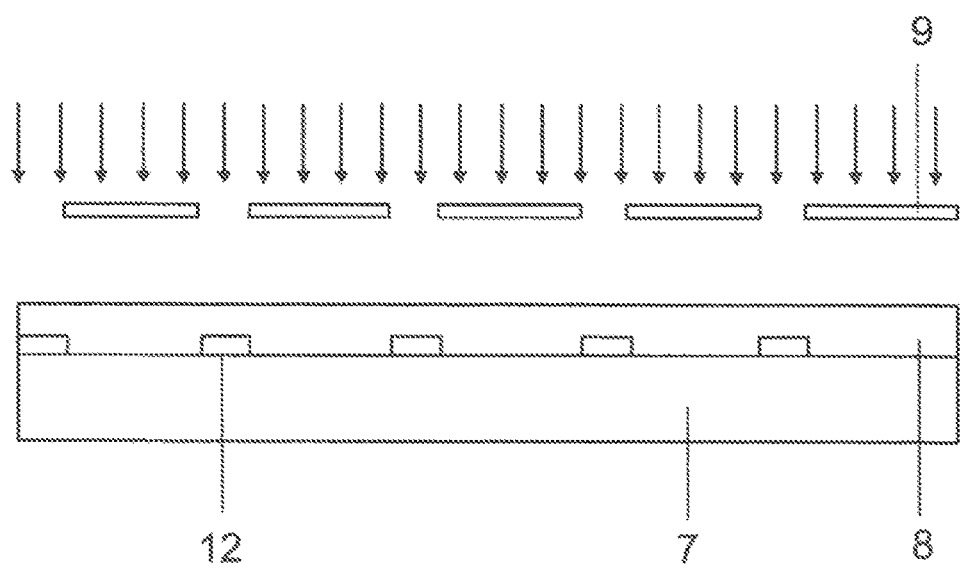

FIG. 6C shows a further method step, in which the filter elements 2 are generated by means of a lithography process. To this end, a mask 9 is arranged on the lacquer layer 8. The mask 9 has structuring which is matched to the desired structuring of the filter layer 8 or of the filter elements 2. By way of example, the mask 9 has cutouts or interruptions in the region of the contact elements 13. Subsequently, the lacquer layer 8 is exposed via the mask 9. In the present example, the photoresist is a positive photoresist, i.e. the regions of the lacquer layer 8 protected from exposure by the mask remain insoluble, while the exposed regions become soluble. However, the photoresist can alternatively also be negative.

Figure 6D:
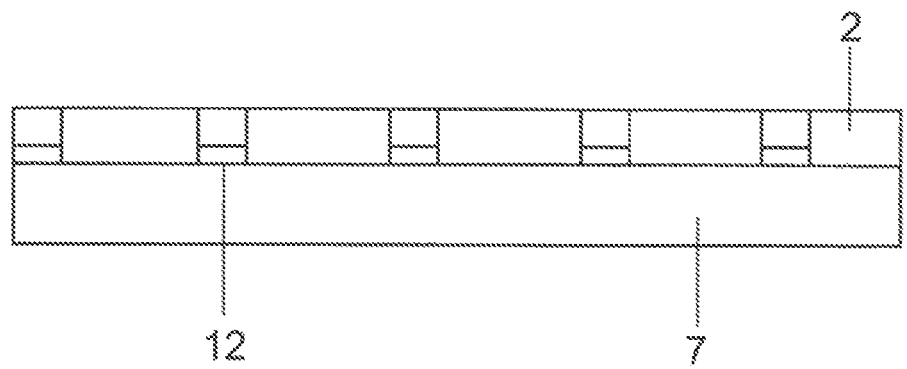

FIG. 6D shows an embodiment of a method step after the soluble regions of the lacquer layer 8 were removed. The lacquer layer 8 is structured by the lithography process in such a way that separate filter elements 2 arise. The filter elements 2 are each arranged on the semiconductor elements 100 arranged in the wafer assemblage 7.

Figure 6E:
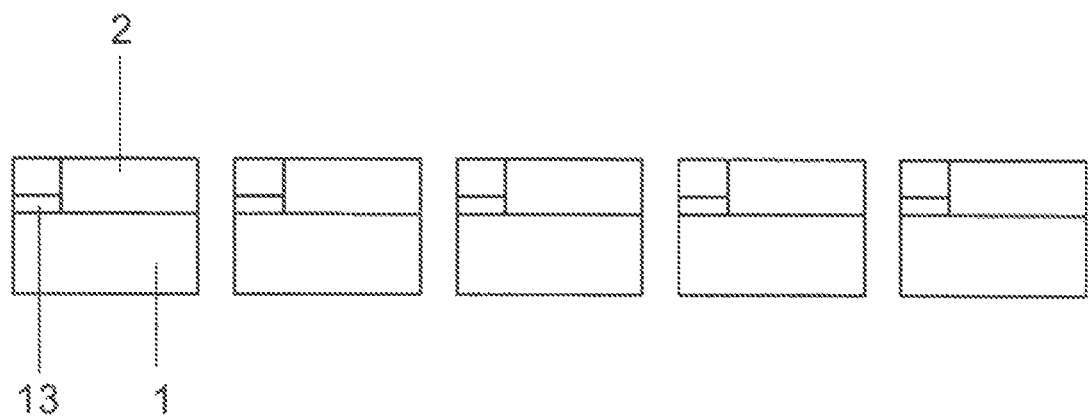

In a further step of the method in accordance with FIG. 6E, the wafer assemblage 7 with the filter elements 2 situated thereon is singulated. By way of example, singulating can be carried out by a laser separation method. Individual semiconductor elements 100 arise as a result of singulating the wafer assemblage 7. The filter elements 2 can be provided with a protective lacquer so as to protect the sensitive filter elements 2 during the laser separation method, said protective lacquer being removed again after the laser separation method.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic semiconductor element, comprising:
at least one LED chip which emits infrared radiation via a top side during operation, wherein
a) the radiation has a global intensity maximum at wavelengths between 800 nm and 1100 nm,
b) the radiation has at most 5% of the intensity of the intensity maximum at a limit wavelength of 750 nm,
c) the radiation has a visible red light component,
a filter element, which is arranged directly or indirectly on the top side of the LED chip and which has a transmissivity of at most 5% for the visible red light component of the LED chip, wherein the transmissivity of the filter element is at least 80%, at least in part, for wavelengths between the limit wavelength and 1100 nm,
a radiation exit surface provided for emitting the filtered radiation, said radiation exit surface being formed by the side of the filter element facing away from the LED chip.

2. The semiconductor element as claimed in claim 1, wherein the filter element is a band-pass filter with a transmission maximum between 800 nm and 1100 nm and with a full width at half maximum of between 3 nm and 60 nm, wherein the filter element has a carrier substrate made of glass or silicon, and wherein a filter layer for filtering the radiation of the LED chip is provided on the carrier substrate.

3. The semiconductor element as claimed in claim 2, wherein the filter element is applied onto the LED chip in such a way that the filter layer faces the LED chip such that the radiation exit surface is formed by the carrier substrate.

4. The semiconductor element as claimed in claim 2, wherein the filter element has sawing grooves at the side surfaces, said sawing grooves being created by a shaping process on the filter element.

5. The semiconductor element as claimed in claim 2, wherein the filter element has lattice defects in the carrier substrate on the side surfaces, said lattice defects being caused by a laser separation method during a shaping process.

6. The semiconductor element as claimed in claim 1, wherein the filter element is a high-pass filter with a GaAs carrier substrate and an AlGaAs filter layer grown onto the carrier substrate, wherein the AlGaAs filter layer is provided for filtering the radiation of the LED chip.

7. The semiconductor element as claimed in claim 6, wherein the filter element is applied onto the LED chip in such a way that the filter layer faces the LED chip such that the radiation exit surface is formed by the carrier substrate.

8. The semiconductor element as claimed in claim 6, wherein the filter element has sawing grooves at the side surfaces, said sawing grooves being created by a shaping process on the filter element.

9. The semiconductor element as claimed in claim 6, wherein the filter element has lattice defects in the carrier substrate on the side surfaces, said lattice defects being caused by a laser separation method during a shaping process.

10. The semiconductor element as claimed in claim 1, wherein the filter element is applied to the top side of the LED chip by a silicone adhesive.

11. The semiconductor element as claimed in claim 1, wherein the filter element is a lacquer layer applied onto the LED chip, said lacquer layer serving as a high-pass filter.

12. The semiconductor element as claimed in claim 1, wherein the filter element covers at least 80% of the surface of the top side of the LED chip provided for radiation emission.

13. The semiconductor element as claimed in claim 1, wherein
the LED chip has a bond pad region, provided for electrical contacting, at one corner of the top side, with no electromagnetic radiation being emitted by way of said bond pad region,
the filter element completely covers the top side of the LED chip except for the bond pad region such that no unfiltered electromagnetic radiation is decoupled from the semiconductor element via the radiation exit surface.

14. The semiconductor element as claimed in claim 1, wherein the LED chip is a thin-film semiconductor chip, which no longer has a growth substrate.

15. An optoelectronic semiconductor device, comprising:
a carrier with a carrier main side,
a first and a second contact metallization which is applied to the carrier main side,
a semiconductor element, which is applied to the carrier main side,
an optoelectronic semiconductor element, comprising:
at least one LED chip which emits infrared radiation via a top side during operation, wherein a) the radiation has a global intensity maximum at wavelengths between 800 nm and 1100 nm,
b) the radiation has at most 5% of the intensity of the intensity maximum at a limit wavelength of 750 nm,
c) the radiation has a visible red light component,
a filter element, which is arranged directly or indirectly on the top side of the LED chip and which has a transmissivity of at most 5% for the visible red light component of the LED chip, wherein the transmissivity of the filter element is at least 80%, at least in part, for wavelengths between the limit wavelength and 1100 nm,
a radiation exit surface provided for emitting the filtered radiation, said radiation exit surface being formed by the side of the filter element facing away from the LED chip,
wherein the radiation exit surface faces away from the carrier main side, and wherein the first contact metallization and second contact metallization electrically contact the semiconductor element.

16. The optoelectronic semiconductor device as claimed in claim 15,
wherein a silicone potting is applied onto the carrier in such a way that the silicone potting surrounds side surfaces of the semiconductor element in a form-fit manner and terminates flush with the radiation exit surface in a direction away from the carrier main side such that the radiation exit surface of the semiconductor element is exposed.

17. The optoelectronic semiconductor device as claimed in claim 16,
wherein the silicone potting has $TiO_2$ particles and it is reflective for radiation emitted by the semiconductor element.

* * * * *